(12) United States Patent
Jin et al.

(10) Patent No.: US 10,930,868 B2
(45) Date of Patent: Feb. 23, 2021

(54) FLEXIBLE ORGANIC LIGHT EMITTING DIODE DISPLAY PREVENTING CURRENT LEAKAGE BETWEEN ORGANIC LIGHT EMITTING UNITS

(71) Applicant: WUHAN CHINA STAR OPTOELECTRONICS TECHNOLOGY CO., LTD., Wuhan (CN)

(72) Inventors: Jiangjiang Jin, Wuhan (CN); Hsiang Lun Hsu, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/570,384

(22) PCT Filed: Jun. 9, 2017

(86) PCT No.: PCT/CN2017/087789
§ 371 (c)(1),
(2) Date: Oct. 30, 2017

(87) PCT Pub. No.: WO2018/196114
PCT Pub. Date: Nov. 1, 2018

(65) Prior Publication Data
US 2020/0052230 A1     Feb. 13, 2020

(30) Foreign Application Priority Data
Apr. 28, 2017 (CN) .......................... 201710293526.7

(51) Int. Cl.
*H01L 29/04* (2006.01)
*H01L 51/00* (2006.01)
(Continued)

(52) U.S. Cl.
CPC ...... *H01L 51/0097* (2013.01); *H01L 51/0027* (2013.01); *H01L 51/0533* (2013.01);
(Continued)

(58) Field of Classification Search
CPC ............. H01L 51/0027; H01L 51/0533; H01L 51/5008; H01L 51/5072; H01L 51/0097; H01L 51/5092; H01L 51/5237
(Continued)

(56) References Cited

U.S. PATENT DOCUMENTS 5,953,587 A * 9/1999 Forrest ................ H01L 27/3209
257/40
6,013,538 A * 1/2000 Burrows ................ H01L 27/32
257/40
(Continued)

*Primary Examiner* — Caleb E Henry
(74) *Attorney, Agent, or Firm* — Soroker Agmon Nordman

(57) ABSTRACT

A flexible organic light emitting diode display and a manufacturing method thereof are provided. The manufacturing method includes steps of forming an active array layer and a photoresist layer sequentially on a flexible substrate, patterning the photoresist layer to form a plurality of pixel units, forming a light emitting main layer between two of the pixel units adjacent to each other, removing the pixel units with an organic solvent, forming a conductive transport layer on the light emitting main layer, and forming an encapsulation layer on the conductive transport layer.

20 Claims, 4 Drawing Sheets

(51) Int. Cl.
*H01L 51/05* (2006.01)
*H01L 51/50* (2006.01)
*H01L 51/52* (2006.01)

(52) U.S. Cl.
CPC ...... *H01L 51/5008* (2013.01); *H01L 51/5072* (2013.01); *H01L 51/5092* (2013.01); *H01L 51/5237* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 7,459,177 B2* | 12/2008 | Kimura | ............... | H01L 51/0005 427/162 |
| 7,923,919 B2* | 4/2011 | Okano | ............... | H01L 27/3283 313/504 |
| 8,482,010 B2* | 7/2013 | Kanegae | ............ | H01L 27/3279 257/72 |
| 8,623,695 B2* | 1/2014 | Nomoto | .............. | H01L 51/0011 257/40 |
| 9,818,811 B2* | 11/2017 | Shin | ..................... | H01L 51/5088 |
| 2004/0207312 A1* | 10/2004 | Takashima | .......... | H01L 51/5092 313/503 |
| 2005/0237780 A1* | 10/2005 | Sakai | .................. | H01L 51/5206 365/111 |
| 2007/0264814 A1* | 11/2007 | Hirai | .................. | H01L 27/1292 438/617 |
| 2011/0017988 A1* | 1/2011 | Yasukawa | ............ | C09D 125/18 257/40 |
| 2011/0180907 A1* | 7/2011 | McConnell | ......... | H01L 51/0012 257/618 |
| 2011/0198598 A1* | 8/2011 | Kim | .................... | H01L 27/3246 257/59 |
| 2012/0241726 A1* | 9/2012 | Kijima | ................ | H01L 51/5278 257/40 |
| 2013/0099218 A1* | 4/2013 | Lee | ...................... | H01L 51/5203 257/40 |
| 2014/0312323 A1* | 10/2014 | Park | ..................... | H01L 51/525 257/40 |
| 2016/0013438 A1* | 1/2016 | Im | .......................... | H01L 51/56 257/40 |
| 2016/0190212 A1* | 6/2016 | Takii | .................... | H01L 27/322 257/40 |
| 2016/0238917 A1* | 8/2016 | Zhang | .................... | G02F 1/167 |
| 2017/0155082 A1* | 6/2017 | Mu | ..................... | H01L 51/5293 |

* cited by examiner

FLEXIBLE ORGANIC LIGHT EMITTING DIODE DISPLAY PREVENTING CURRENT LEAKAGE BETWEEN ORGANIC LIGHT EMITTING UNITS

FIELD OF THE INVENTION

The present disclosure relates to the technical field of displays, and in particular to a flexible organic light emitting diode display and a manufacturing method thereof.

BACKGROUND OF THE DISCLOSURE

Flexible optoelectronics are widely used in the next generation of displays, lamination, sensors, and renewable energy. In particular, organic optoelectronics, such as organic light emitting diodes (OLEDs) and organic photovoltaic cells (OPV) have been employed in a variety of wearable flexible smart electronic products, such as flexible smart phones, foldable touch screens, and so on. In particular, flexible organic light emitting diodes (flexible OLED) show great market potential.

However, during the bending or folding of a conventional OLED, the pixel definition layer may be easily separated from an OLED display layer, and current leakage may easily occur between the organic light emitting units.

Therefore, it is necessary to provide a flexible organic light emitting diode display and a manufacturing method thereof to solve the problems existing in the prior art.

SUMMARY OF THE INVENTION

An object of the present disclosure is to provide a flexible organic light emitting diode display and a manufacturing method thereof, which prevent current leakage between organic light emitting units.

To resolve the above technical problem, the present disclosure provides a method for manufacturing a flexible organic light emitting diode display, comprising steps of:

forming an active array layer on a flexible substrate;

coating an organic negative photoresist material onto the active array layer to form a photoresist layer;

patterning the photoresist layer to form a plurality of pixel units;

forming a light emitting main layer between two of the pixel units adjacent to each other, wherein the light emitting main layer includes an anode, a hole transport layer, a hole injection layer, and a light emitting layer;

removing the pixel units with an organic solvent;

forming a conductive transport layer on the light emitting main layer, wherein the conductive transport layer includes an electron transport layer, an electron injection layer, and a cathode; and forming a first organic layer, a first inorganic layer, a second organic layer, and a second inorganic layer sequentially on the conductive transport layer.

In the method for manufacturing the flexible organic light emitting diode display, a thickness of the photoresist layer ranges from 0.5 μm to 2 μm.

In the method for manufacturing the flexible organic light emitting diode display, a thickness of the first organic layer and a thickness of the second organic layer both range from 1 μm to 12 μm.

In the method for manufacturing the flexible organic light emitting diode display, a material of the first organic layer is a low temperature heat curing compound or an ultraviolet light curing compound.

In the method for manufacturing the flexible organic light emitting diode display, a thickness of the first inorganic layer and a thickness of the second inorganic layer both range from 0.5 μm to 1 μm.

In the method for manufacturing the flexible organic light emitting diode display, a material of the first inorganic layer includes at least one of zirconium aluminate, graphene, alumina, zirconium dioxide, zinc oxide, silicon nitride, silicon carbonitride, $SiO_x$, titanium dioxide, and diamond-like carbon.

In the method for manufacturing the flexible organic light emitting diode display, the method further comprises a step of sequentially forming a third organic layer and a third inorganic layer on the second inorganic layer.

The present disclosure further provides a method for manufacturing a flexible organic light emitting diode display, comprising steps of:

forming an active array layer and a photoresist layer sequentially on a flexible substrate;

patterning the photoresist layer to form a plurality of pixel units;

forming a light emitting main layer between two of the pixel units adjacent to each other, wherein the light emitting main layer includes an anode, a hole transport layer, a hole injection layer, and a light emitting layer;

removing the pixel units with an organic solvent;

forming a conductive transport layer on the light emitting main layer, wherein the conductive transport layer includes an electron transport layer, an electron injection layer, and a cathode; and forming an encapsulation layer on the conductive transport layer.

In the method for manufacturing the flexible organic light emitting diode display, the step of sequentially forming the active array layer and the photoresist layer on a flexible substrate comprises a step of coating an organic negative photoresist material onto the active array layer to form the photoresist layer.

In the method for manufacturing the flexible organic light emitting diode display, a thickness of the photoresist layer ranges from 0.5 μm to 2 μm.

In the method for manufacturing the flexible organic light emitting diode display, the step of forming the encapsulation layer on the conductive transport layer comprises a step of sequentially forming a first organic layer, a first inorganic layer, a second organic layer, and a second inorganic layer on the conductive transport layer.

In the method for manufacturing the flexible organic light emitting diode display, a thickness of the first organic layer and a thickness of the second organic layer both range from 1 μm to 12 μm.

In the method for manufacturing the flexible organic light emitting diode display, a material of the first organic layer is a low temperature heat curing compound or an ultraviolet light curing compound.

In the method for manufacturing the flexible organic light emitting diode display, a thickness of the first inorganic layer and a thickness of the second inorganic layer both range from 0.5 μm to 1 μm.

In the method for manufacturing the flexible organic light emitting diode display, a material of the first inorganic layer includes at least one of zirconium aluminate, graphene, alumina, zirconium dioxide, zinc oxide, silicon nitride, silicon carbonitride, $SiO_x$, titanium dioxide, and diamond-like carbon.

In the method for manufacturing the flexible organic light emitting diode display, the method further comprises a step of sequentially forming a third organic layer and a third inorganic layer on the second inorganic layer.

The present disclosure further provides a flexible organic light emitting diode display, comprising
a flexible substrate;
an active array layer disposed on the flexible substrate;
a light emitting main layer disposed on the active array layer;
a conductive transport layer disposed on the light emitting main layer; and
an encapsulation layer disposed on the conductive transport layer.

In the flexible organic light emitting diode display, a thickness of the photoresist layer ranges from 0.5 µm to 2 µm.

In the flexible organic light emitting diode display, the encapsulation layer includes a first organic layer, a first inorganic layer, a second organic layer, and a second inorganic layer.

In the flexible organic light emitting diode display, the encapsulation layer further includes a third organic layer and a third inorganic layer.

In the flexible organic light emitting diode display and the manufacturing method thereof in the present disclosure, an organic material is employed to form a pixel definition layer, so that the OLED display layer is covered by the organic layer, thereby preventing the OLED display layer from being separated from the pixel definition layer during bending or folding. In addition, the organic material is used as the pixel definition layer to isolate the organic light emitting units, and the current leakage is effectively prevented.

DETAILED DESCRIPTION OF THE PREFERRED EMBODIMENTS

The following description of the embodiments with reference to the accompanying drawings is used to illustrate particular embodiments of the present invention. The directional terms referred in the present invention, such as "upper", "lower", "front", "back", "left", "right", "inner", "outer", "side surface", etc. are only directions with regard to the accompanying drawings. Therefore, the directional terms used for describing and illustrating the present invention are not intended to limit the present invention.

Figure 1:
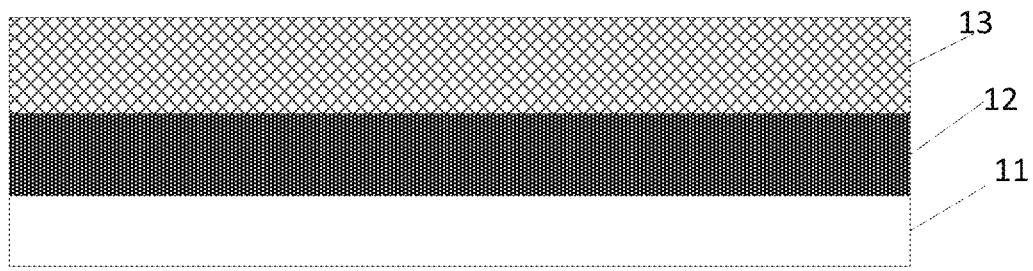
FIG. 1 is a schematic view of a first step of a method for manufacturing a flexible organic light emitting diode display of the present disclosure.

Refer to FIGS. 1-11. FIG. 1 is a schematic diagram of a first step of a method for manufacturing a flexible organic light emitting diode display of the present disclosure.

The method for manufacturing the flexible organic light emitting diode display of the present disclosure comprises the following steps.

In Step S101, an active array layer and a photoresist layer are sequentially formed on the flexible substrate.

As shown in FIG. 1, the active array layer 12 and the photoresist layer 13 are sequentially formed on the flexible substrate 11. The active array layer 12 has a plurality of thin film transistors including a gate, a source, and a drain. The active array layer 12 includes an active layer, which is used for forming channels, a gate insulating layer, a first metal layer, an interlayer insulating layer, and a second metal layer.

In particular, the step may include the following steps:

In Step S1011, an organic negative photoresist material is coated onto the active array layer to form a photoresist layer.

For example, a layer of the organic negative photoresist material is coated on the active array layer 12 to form the photoresist layer 13 by one of the methods, such as ink jet printing (IJP), spin coating, slot coating, screen printing, etc.

In an embodiment, the thickness of the photoresist layer 13 ranges from 0.5 µm to 2 µm. When the thickness is within this range, the organic light emitting units are effectively defined and formed.

In Step S102, the photoresist layer is patterned to form a plurality of pixel units.

Figure 2:
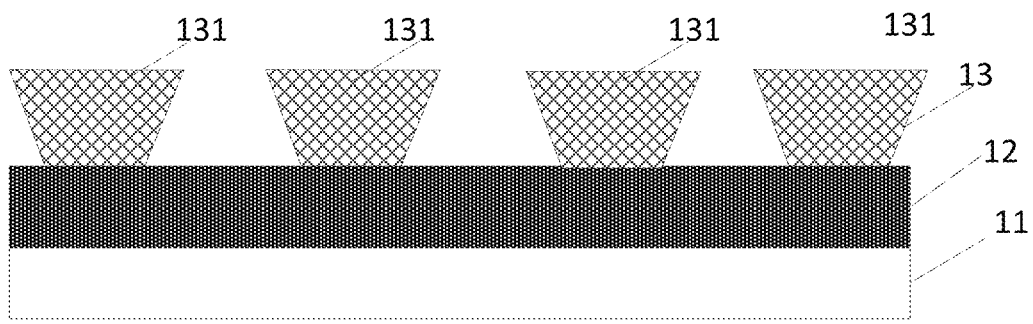
FIG. 2 is a schematic view of a second step of the method for manufacturing a flexible organic light emitting diode display of the present disclosure.

As shown in FIG. 2, the photoresist layer 13 is exposed and developed according to size of the organic light emitting units (size of the R, G, and B pixels), to form a plurality of the pixel units 131. That is, the photoresist layer 13 is used for forming a pixel definition layer, and the pixel definition layer includes a plurality of the pixel units 131.

In Step S103, a light emitting main layer is formed between two of the pixel units, wherein the light emitting main layer includes an anode, a hole transport layer, a hole injection layer, and a light emitting layer.

Figure 3:
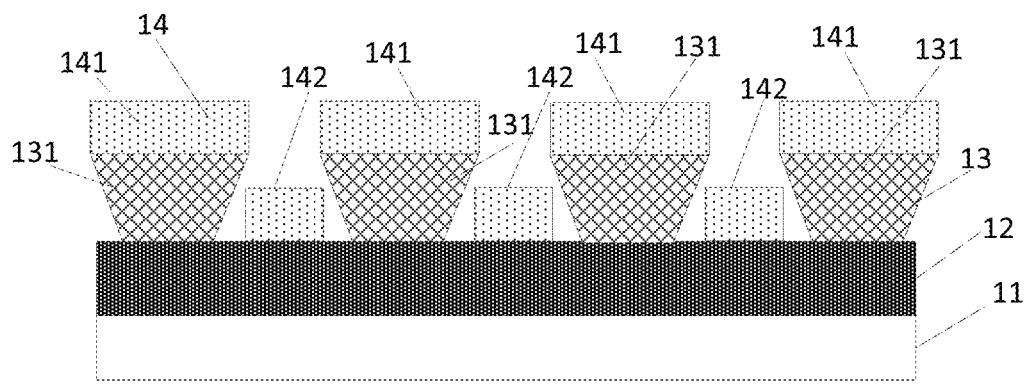
FIG. 3 is a schematic view of a third step of the method for manufacturing a flexible organic light emitting diode display of the present disclosure.

As shown in FIG. 3, the anode, the hole transport layer, the hole injection layer, and the light emitting layer 14 (which are shown as a single layer structure in the figure) are sequentially deposited on the pixel units 131, respectively, using a common mask and a fine metal mask, thereby forming a deposition layer 141 on the pixel definition layer 13 and forming the light emitting main layer 142 between two of the pixel units 131 adjacent to each other (e.g., R, G, and B pixel definition regions). The light emitting main layer 142 includes R, G, and B light emitting main layers.

In Step S104, the pixel units are removed with an organic solvent.

Figure 4:
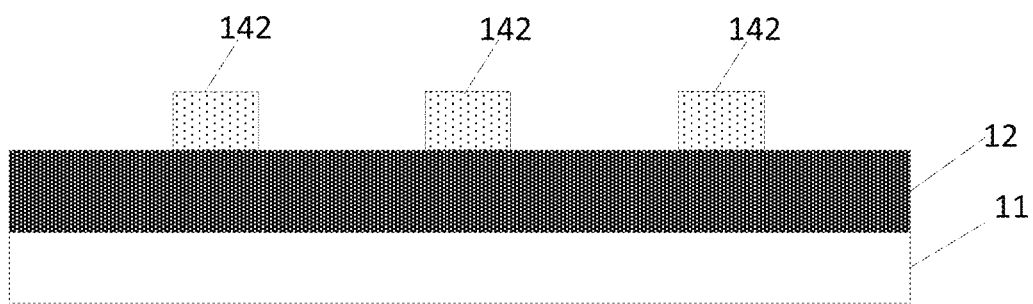
FIG. 4 is a schematic view of a fourth step of the method for manufacturing a flexible organic light emitting diode display of the present disclosure.

As shown in FIG. 4, the pixel units 131 are peeled off with a fluorine-based organic solvent, so that the deposition layer 141 located on the pixel units 131 is also removed, thereby leaving only the light emitting main layer 142.

In Step S105, a conductive transport layer is formed on the light emitting main layer, wherein the conductive transport layer includes an electron transport layer, an electron injection layer, and a cathode.

Figure 5:
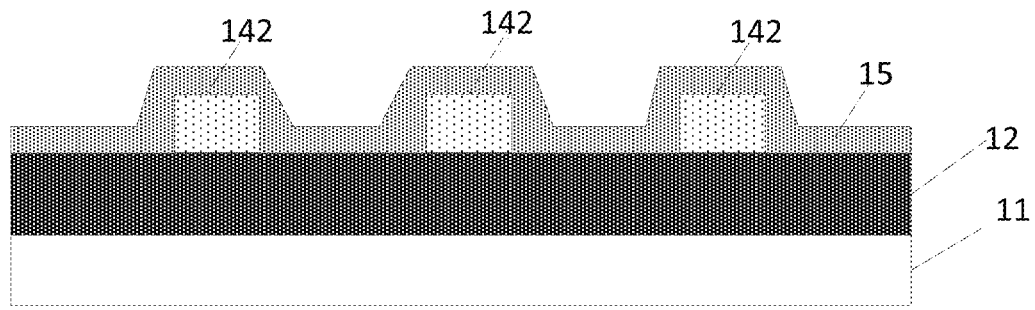
FIG. 5 is a schematic view of a fifth step of the method for manufacturing a flexible organic light emitting diode display of the present disclosure.

As shown in FIG. 5, an electron transport layer, an electron injection layer, and a cathode (which are shown as a single layer structure in the figure) are sequentially deposited on the light emitting main layer 142 through a vapor deposition process to form a conductive transport layer 15. The conductive transport layer 15 together with the light emitting main layer 142 forms an intact OLED display layer, wherein the OLED display layer includes a plurality of organic light emitting units.

In Step S106, an encapsulating layer is formed on the conductive transport layer.

In particular, the step may include the following steps:

In Step S1061, a first organic layer is formed on the conductive transport layer.

Figure 6:
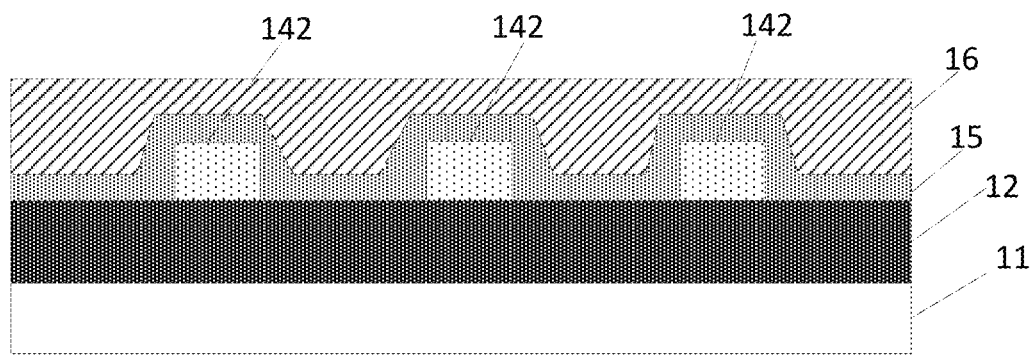
FIG. 6 is a schematic view of a sixth step of the method for manufacturing a flexible organic light emitting diode display of the present disclosure.

As shown in FIG. 6, an organic material is coated on the conductive transport layer 15, again using one of the methods, such as LIP, spin-coating, screen printing, and slot coating to form a first organic layer 16. The first organic layer 16 serves to flatten the surface of the flexible organic light emitting diode display. Material of the organic layer 16 may be a low temperature heat curing compound or an ultraviolet (UV) light curing compound. The resulting polymer may be any one of an acrylic type polymer, a silane type polymer, and an epoxy resin polymer.

Thickness of the first organic layer 16 ranges from 1 µm to 12 µm. When the thickness is within this range, the surface of the organic light emitting diode may be flattened without increasing thickness of the display.

In Step S1062, a first inorganic layer is formed on the first organic layer.

Figure 7:
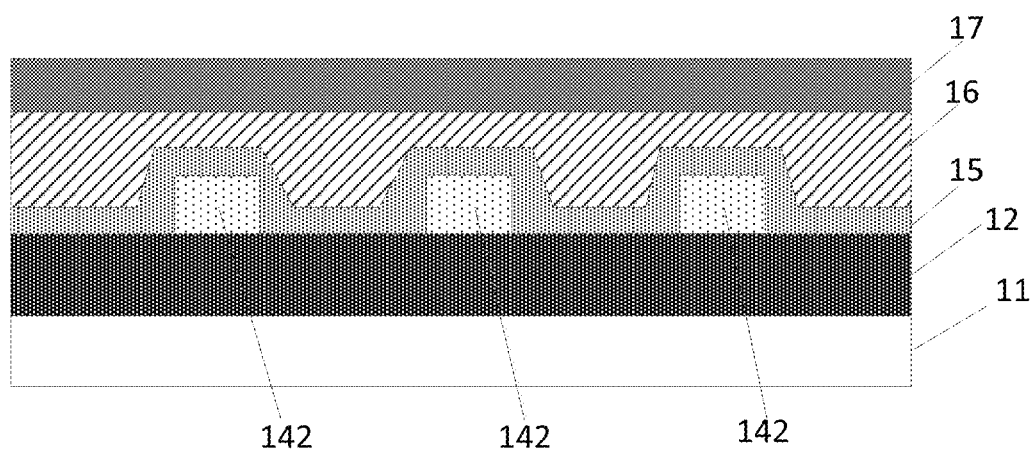
FIG. 7 is a schematic view of a seventh step of the method for manufacturing a flexible organic light emitting diode display of the present disclosure.

As shown in FIG. 7, an inorganic material is deposited on the first organic layer 16, using one of the methods, such as atomic layer deposition (ALD), pulsed laser deposition (PLD), sputtering, plasma enhanced chemical vapor deposition (PECVD), etc., to form a first inorganic layer 17 for blocking outside moisture and oxygen.

The material of the first inorganic layer 17 includes at least one of a metal oxide or a metal sulfide, a non-metallic oxide or a non-metallic sulfide. In particular, the material of the first inorganic layer may includes at least one of $ZrAl_xO_y$ (zirconium aluminate), graphene, alumina ($Al_2O_3$), zirconium dioxide ($ZrO_2$), zinc oxide ($ZnO_2$), silicon nitride ($SiN_x$), silicon carbonitride (SiCN), $SiO_x$, titanium dioxide ($TiO_2$), and diamond-like carbon. Since these materials are insoluble in water and do not react with oxygen, corrosion resistance is strong, so that the first inorganic layer 17 has the characteristic of effectively blocking moisture and oxygen. Thus, the organic light emitting units may be effectively prevented from being corroded.

The thickness of the first inorganic layer 17 ranges from 0.5 µm into 1 µm. When the thickness is within this range, the first inorganic layer 17 may effectively block the outside moisture and oxygen without increasing the thickness of the display.

In Step S1063, a second organic layer is formed on the first inorganic layer.

Figure 8:
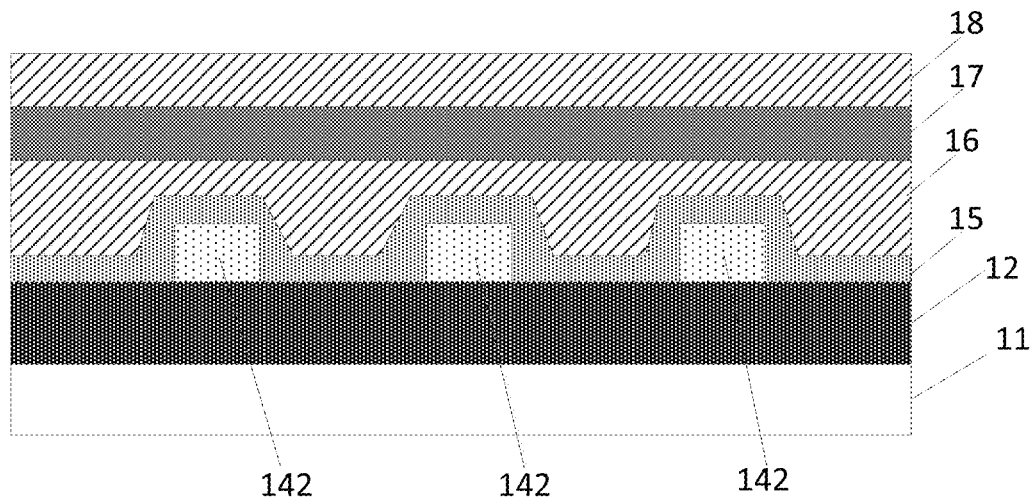
FIG. 8 is a schematic view of an eighth step of the method for manufacturing a flexible organic light emitting diode display of the present disclosure.

As shown in FIG. 8, an organic material is coated on the first inorganic layer, again using one of the methods, such as IJP, spin-coating, screen printing, and slot coating to form a second organic layer 18. The second organic layer 18 serves to relieve the stress generated during bending.

Thickness of the second organic layer 18 ranges from 1 µm to 12 µm. When the thickness is within this range, the second organic layer 18 may effectively protect the organic light emitting diode without increasing thickness of the display.

In Step S1064, a second inorganic layer is formed on the second organic layer.

Figure 9:
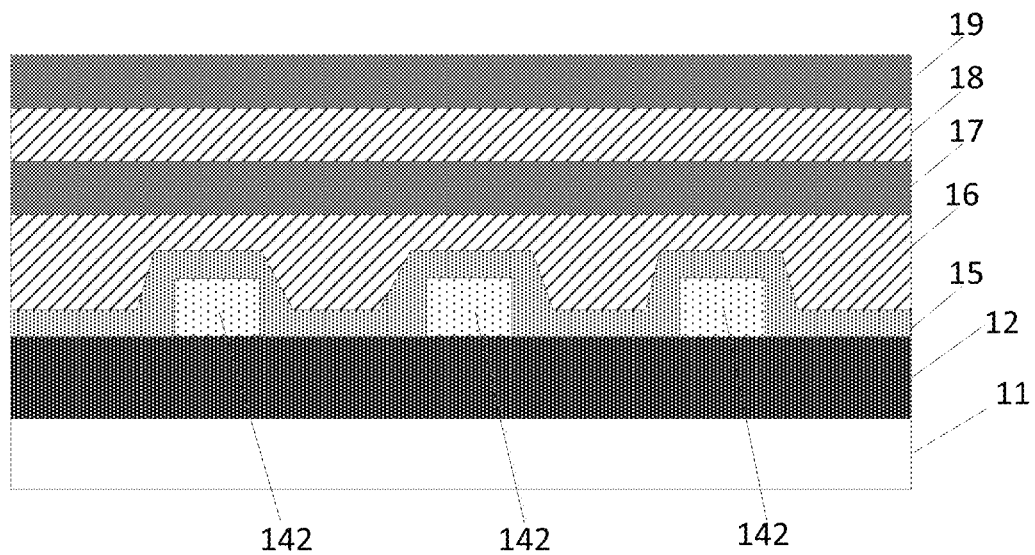
FIG. 9 is a schematic view of a ninth step of the method for manufacturing a flexible organic light emitting diode display of the present disclosure.

As shown in FIG. 9, an inorganic material is deposited on the second organic layer 18 by using one of the methods, such as PECVD, ALD, PLD, sputtering, etc., to form a second inorganic layer 19, which is used for blocking outside moisture and oxygen. The thickness or the material of the second inorganic layer 19 may be the same as the thickness or the material of the first inorganic layer 17.

Preferably, the aforementioned method may further comprise the following steps:

In Step S107, a third organic layer is formed on the second inorganic layer.

Figure 10:
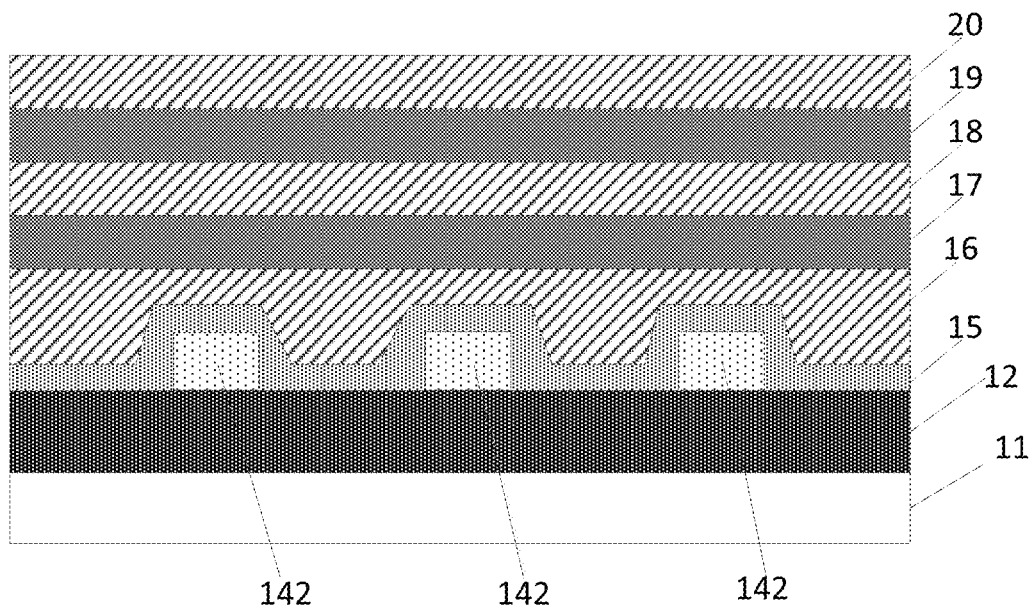
FIG. 10 is a schematic view of a tenth step of the method for manufacturing a flexible organic light emitting diode display of the present disclosure.

As shown in FIG. 10, an organic material is coated, using one of the methods, such as IJP, spin-coating, screen printing, and slot coating to form a third organic layer 20. The thickness or the material of the third organic layer 20 may be the same as the thickness or the material of the first organic layer 16 or the second organic layer 18.

In Step S108, a third inorganic layer is formed on the third organic layer.

Figure 11:
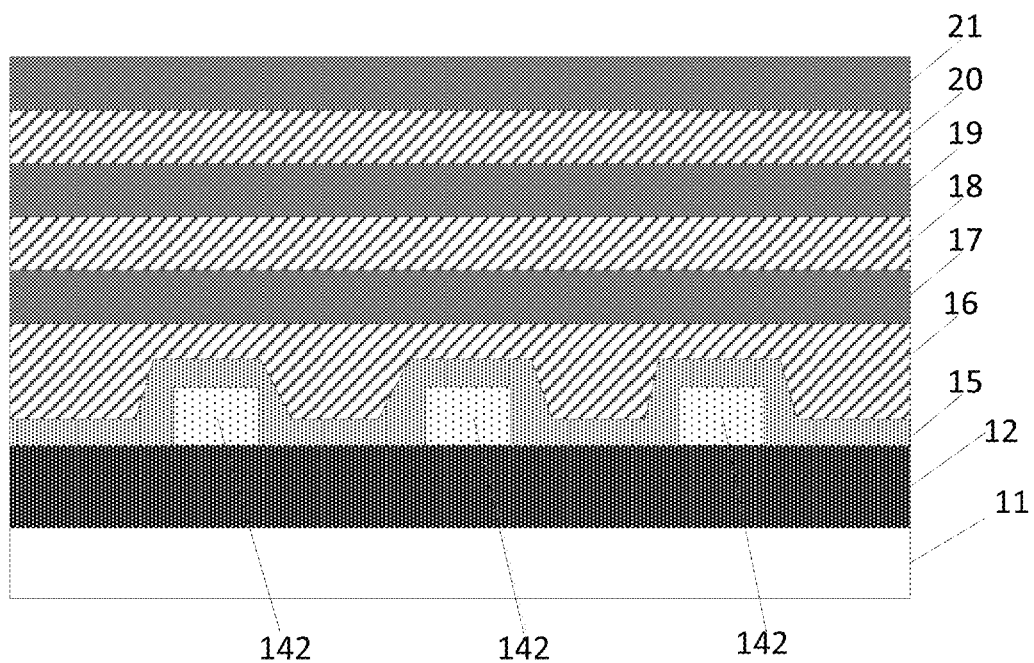
FIG. 11 is a schematic view of an eleventh step of the method for manufacturing a flexible organic light emitting diode display of the present disclosure.

As shown in FIG. 11, an inorganic material is deposited on the third organic layer 20 by using one of the methods, such as PECVD, ALD, PLD, sputtering, etc., to form a third inorganic layer 21. The thickness or the material of the third inorganic layer 21 may be the same as the thickness or the material of the first inorganic layer 17 or the second inorganic layer 19.

Since the organic layer and the inorganic layer are further disposed on the second inorganic layer, the ability to block the outside moisture and oxygen is further enhanced, and the organic light emitting diode is effectively protected.

Since the organic material is used as the pixel definition layer to isolate the organic light emitting units, the current leakage is effectively prevented, and the organic light emitting units are prevented from being deformed or peeled off during bending or folding. In addition, the inorganic and organic alternating packaging structure is employed to improve the lifespan of components, in order to achieve the technology of the full color flexible OLED displays with high resolution RGB.

As shown in FIG. 9, an embodiment of the present disclosure provides a flexible organic light emitting diode display including a flexible substrate 11, an active array layer 12, a light emitting main layer 142, a conductive transport layer 15, and an encapsulation layer 16-19. The active array layer 12 is located on the flexible substrate 11, the light emitting main layer 142 is located on the active array layer 12, the conductive transport layer 15 is located on the light emitting main layer 142, and the encapsulation layers 16-19 are located on the conductive transport layer 15.

In the flexible organic light emitting diode display, and the manufacturing method thereof in the present disclosure, an organic material is employed to form a pixel definition layer so that the OLED display layer is covered in the organic layer, thereby preventing the OLED display layer from being separated from the pixel definition layer during bending or folding. In addition, the organic material is used as the pixel definition layer to isolate the organic light emitting units, and the current leakage is effectively prevented.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A method for manufacturing a flexible organic light emitting diode display, comprising steps of:
    forming an active array layer on a flexible substrate;
    coating an organic negative photoresist material onto the active array layer, to form a photoresist layer;
    patterning the photoresist layer to form a plurality of pixel units;
    forming a light emitting main layer between two of the pixel units adjacent to each other, wherein the light emitting main layer includes an anode, a hole transport layer, a hole injection layer, and a light emitting layer;
    removing the pixel units with an organic solvent;
    forming a conductive transport layer on the light emitting main layer, wherein the conductive transport layer includes an electron transport layer, an electron injection layer, and a cathode; and
    forming a first organic layer, a first inorganic layer, a second organic layer, and a second inorganic layer sequentially on the conductive transport layer.

2. The method for manufacturing the flexible organic light emitting diode display as claimed in claim 1, wherein a thickness of the photoresist layer ranges from 0.5 µm to 2 µm.

3. The method for manufacturing the flexible organic light emitting diode display as claimed in claim 1, wherein a thickness of the first organic layer and a thickness of the second organic layer both range from 1 µm to 12 µm.

4. The method for manufacturing the flexible organic light emitting diode display as claimed in claim 1, wherein a material of the first organic layer is a low temperature heat curing compound or an ultraviolet light curing compound.

5. The method for manufacturing the flexible organic light emitting diode display as claimed in claim 1, wherein a thickness of the first inorganic layer and a thickness of the second inorganic layer both range from 0.5 µm to 1 µm.

6. The method for manufacturing the flexible organic light emitting diode display as claimed claim 1, wherein a material of the first inorganic layer includes at least one of zirconium aluminate, graphene, alumina, zirconium dioxide, zinc oxide, silicon nitride, silicon carbonitride, $SiO_x$, titanium dioxide, and diamond-like carbon.

7. The method for manufacturing the flexible organic light emitting diode display as claimed in claim 1, further comprising a step of:
    forming a third organic layer and a third inorganic layer sequentially on the second inorganic layer.

8. A method for manufacturing a flexible organic light emitting diode display, comprising steps of:
    forming an active array layer and a photoresist layer sequentially on a flexible substrate;
    patterning the photoresist layer to form a plurality of pixel units;
    forming a light emitting main layer between two of the pixel units adjacent to each other, wherein the light emitting main layer includes an anode, a hole transport layer, a hole injection layer, and a light emitting layer;
    removing the pixel units with an organic solvent;
    forming a conductive transport layer on the light emitting main layer, wherein the conductive transport layer includes an electron transport layer, an electron injection layer, and a cathode; and
    forming an encapsulation layer on the conductive transport layer.

9. The method for manufacturing the flexible organic light emitting diode display as claimed in claim 8, wherein the step of sequentially forming the active array layer and the photoresist layer on a flexible substrate comprises a step of coating an organic negative photoresist material onto the active array layer to form the photoresist layer.

10. The method for manufacturing the flexible organic light emitting diode display as claimed in claim 8, wherein a thickness of the photoresist layer ranges from 0.5 µm to 2 µm.

11. The method for manufacturing the flexible organic light emitting diode display as claimed in claim 8, wherein the step of forming the encapsulation layer on the conductive transport layer comprises a step of forming a first organic layer, a first inorganic layer, a second organic layer, and a second inorganic layer sequentially on the conductive transport layer.

12. The method for manufacturing the flexible organic light emitting diode display as claimed in claim 11, wherein a thickness of the first organic layer and a thickness of the second organic layer both range from 1 µm to 12 µm.

13. The method for manufacturing the flexible organic light emitting diode display as claimed in claim 11, wherein a material of the first organic layer is a low temperature heat curing compound or an ultraviolet light curing compound.

14. The method for manufacturing the flexible organic light emitting diode display as claimed in claim 11, wherein a thickness of the first inorganic layer and a thickness of the second inorganic layer both range from 0.5 µm to 1 µm.

15. The method for manufacturing the flexible organic light emitting diode display as claimed claim 11, wherein a material of the first inorganic layer includes at least one of zirconium aluminate, graphene, alumina, zirconium dioxide, zinc oxide, silicon nitride, silicon carbonitride, $SiO_x$, titanium dioxide, and diamond-like carbon.

16. The method for manufacturing the flexible organic light emitting diode display as claimed in claim 1, further comprising a step of:
    forming a third organic layer and a third inorganic layer sequentially on the second inorganic layer.

17. A flexible organic light emitting diode display, comprising
    a flexible substrate;
    an active array layer disposed on the flexible substrate;
    a light emitting main layer disposed on the active array layer;
    a conductive transport layer disposed on the light emitting main layer and the active array layer; and
    an encapsulation layer disposed on the conductive transport layer, wherein the encapsulation layer includes a first organic layer directly disposed on the conductive transport layer, and the light emitting main layer is partitioned by parts of the first organic layer to form pixels.

18. The flexible organic light emitting diode display as claimed in claim 17, wherein a material of the first organic layer is a low temperature heat curing compound or an ultraviolet light curing compound.

19. The flexible organic light emitting diode display as claimed in claim 17, wherein the encapsulation layer further includes a first inorganic layer, a second organic layer, and a second inorganic layer.

20. The flexible organic light emitting diode display as claimed in claim 19, wherein the encapsulation layer further includes a third organic layer and a third inorganic layer.

* * * * *